(12) United States Patent
Rundo

(10) Patent No.: US 6,501,281 B1
(45) Date of Patent: Dec. 31, 2002

(54) CAPACITIVE, OPERATOR-SENSING CIRCUIT FOR DISABLING ENGINE OF MOBILE POWER EQUIPMENT

(75) Inventor: James A. Rundo, Chesterland, OH (US)

(73) Assignee: Delta Systems, Inc., Streetsboro, OH (US)

(*) Notice: Subject to any disclaimer, the term of this patent is extended or adjusted under 35 U.S.C. 154(b) by 373 days.

(21) Appl. No.: 09/618,868

(22) Filed: Jul. 19, 2000

(51) Int. Cl.⁷ ............................................. G01R 27/26
(52) U.S. Cl. ..................................... 324/658; 324/686
(58) Field of Search ............................ 324/76.66, 382, 324/427, 519, 584, 658, 686; 318/751, 794, 796; 340/545.1, 562; 361/15, 181, 251; 702/47, 52

(56) References Cited

U.S. PATENT DOCUMENTS

| | | | |
|---|---|---|---|
| 3,111,800 A | | 11/1963 | Quianthy |
| 3,991,618 A | * | 11/1976 | Stampfer ..................... 73/432 |
| 4,003,190 A | | 1/1977 | Braun et al. |
| 4,145,864 A | | 3/1979 | Brewster, Jr. |
| 4,794,273 A | | 12/1988 | McCullough et al. |
| 4,814,632 A | | 3/1989 | Glaeser et al. |
| 4,981,011 A | | 1/1991 | Olejak |
| 5,120,980 A | | 6/1992 | Fontaine |
| 5,138,824 A | | 8/1992 | Oshima et al. |
| 5,644,551 A | * | 7/1997 | Carmichael ..................... 368/5 |
| 5,646,461 A | | 7/1997 | Kubota |
| 6,170,241 B1 | * | 1/2002 | Shibiski ....................... 56/11.9 |

OTHER PUBLICATIONS

Nine page article entitled "Charge Transfer Sensing—Spread Spectrum Sensor Technology Blazes New Applications", copyright 1997, by Hal Philipp. (Month Unavailable).

Twelve Page Product Specification Sheet Entitled "QProx™ QT110 Charge–Transfer Touch Circuit", Published by Quantum Research Group Ltd., Copyright 1999. (Month Unavailable).

* cited by examiner

Primary Examiner—Michael Sherry
Assistant Examiner—Trung Nguyen
(74) Attorney, Agent, or Firm—Watts, Hoffmann, Fisher & Heinke, Co. LPA

(57) ABSTRACT

A capacitive, operator-sensing circuit for mobile power equipment includes a charge-transfer touch sensor that is electrically coupled to at least one sensing electrode mounted on a gripping surface of the mobile power equipment. The charge-transfer touch sensor is preferably a digital integrated circuit that operates to change an output voltage between two levels or states (logic high and logic low) depending upon a quantity of charge sensed on the at least one sensing electrode, the sensed charge on the at least one sensing electrode changing with the presence or absence of an operator's hand on the at least one sensing electrode. The charge-transfer touch sensor outputs a DC voltage signal, maintaining a given output voltage level until the sensor senses a predetermined change in sensed charge on the sensing electrode. The capacitive operator-sensing circuit additionally includes coupling circuitry coupled between the charge-transfer touch sensor and a component of the equipment. A change in sensor output voltage from a first level to a second level causes a cessation of operation of the component. For example, the component may be an internal combustion engine of the equipment and a change in sensor output voltage from the first level to the second level causes the coupling circuitry to electrically couple a magneto of the engine to be coupled to ground thereby shutting off the engine.

36 Claims, 3 Drawing Sheets

CAPACITIVE, OPERATOR-SENSING CIRCUIT FOR DISABLING ENGINE OF MOBILE POWER EQUIPMENT

FIELD OF THE INVENTION

This invention relates generally to a capacitive, operator-sensing circuit for disabling a component, such as an internal combustion engine, of mobile power equipment and, more particularly, a capacitive, operator-sensing circuit including a charge-transfer sensor coupled to a capacitive sensing electrode affixed to a gripping surface of the mobile power equipment, the circuit functioning to disable the component upon sensing a change in the charge of the sensing electrode as a result of an operator removing his or her hand from the gripping surface.

BACKGROUND ART

Various types of mobile power equipment driven by internal combustion engines are in widespread use today such as lawn and garden maintenance equipment, construction equipment, and agricultural implements. Examples of such internal combustion mobile power equipment include power lawnmowers (push and self propelled), rototillers, cultivators, snowblowers, power lawn edgers, riding lawnmowers, garden tractors, etc. Such equipment includes a handle or gripping surfaces which is/are used by the operator to push the equipment (if not self-propelled) and/or direct the equipment movement along a desired path of travel. Gripping surface might include a steering wheel and steering wheel spokes of a riding lawnmower or the steering levers of a skid steer vehicle. A constant concern with such mobile power equipment is insuring that the engine is disabled (turned off) in the event that the operator losses control of the equipment, i.e., the operator losses his or her grip on the handle or gripping surfaces. In some types of mobile power equipment a working implement, such as a cutting blade or an auger, is driven by the motor and there is an electrical or mechanical clutch disposed between the engine, a transmission and the working implement. In such equipment instead of turning off the engine, it may be sufficient to disengage the clutch when the operator losses his or her grip on the handle. Disengaging the clutch insures the working implement is no longer driven by the engine even though the engine continues to run. Such a clutch arrangement is used in equipment having a working implement driven by a power take-off drive system. A power take-off drive system typically includes a drive shaft to which the working implement (cutting blade, auger, etc.) is attached. When the power take-off drive is engaged, the engine rotates the power take; off drive shaft.

Various types of mechanical assemblies have been used on such mobile power equipment to shut off the engine and/or disengage the power take-off drive system in the event that the operator losses his or her grip on the handle or gripping surfaces. Generally such mechanical assemblies included a lever or rod that is required to be pivoted to a position adjacent, for example, the handle for the engine to operate. The operator thus grips both the lever and the handle simultaneously to maintain the lever adjacent the handle. The lever is typically biased by a spring to swing away from the handle if the operator releases his or her grip on the handle thereby shutting off the engine and/or drive wheels on self-propelled mobile power equipment and/or disengage a power take-off drive shaft.

Such mechanical assemblies have several disadvantages including being costly to install and maintain, adding additional weight to the equipment and continuously exerting pressure against the operator's hand causing operator fatigue. Additionally, such mechanical assemblies are capable of being defeating by simply tying the lever to the handle with a piece of rope or twine.

An electrical operator-sensing circuit would overcome many of the disadvantages of a mechanical assembly including fatigue and defeatability. One such electrical circuit proposal is disclosed in U.S. Pat. No. 4,145,864 to Brewster, Jr. The '864 patent discloses an operator sensing circuit that requires an operator to electrically bridge first and second spaced apart operator contacts mounted on the lawnmower handle of an electric lawnmower for actuation of the electric motor that drives the cutting blade. However, the '864 patent requires that both hands of the operator be on the handle. It is often desirable and necessary to permit continued operation of the equipment if the operator maintains one hand on the handle, e.g., the operator removes one hand from the handle to wipe his or her brow or push low hanging branches out of the way when mowing under a tree. Additionally, the '864 patent teaches the use of a phase lock loop circuit requiring a signal generator and signal receiver which is relatively complex and expensive.

What is needed is a simple-to-fabricate and install, low-cost, rugged, durable and difficult to defeat operator-sensing circuit which permits continued operation of the power equipment when at least one hand of the operator is maintained on the equipment handle.

SUMMARY OF THE INVENTION

A capacitive, operator-sensing circuit for mobile power equipment includes a charge-transfer touch sensor that is electrically coupled to at least one capacitive sensing electrode affixed to a gripping surface of the mobile power equipment. The charge-transfer sensor periodically generates charge bursts that are coupled to the sensing electrode and a floating transfer capacitor. The charge-transfer sensor senses the charge buildup on the sensing electrode resulting from the charge bursts. The sensor changes an output signal between a first and a second states if the sensed charge changes by a predetermined threshold magnitude.

The charge-transfer sensor is preferably a digital integrated circuit that operates to change an output voltage signal between two levels or states depending upon sensed charge of the sensing electrode. The gain and sensitivity of the sensor are configured such that the sensed charge of the sensing electrode changes by the predetermined threshold magnitude (or more) when an operator's hand is moved from a position of gripping or touching the gripping surface to a position of not gripping or touching the surface. The charge-transfer sensor outputs a DC voltage signal, maintaining a given output voltage level until the sensor senses a change in the sensed charged of the predetermined threshold value.

The operator-sensing circuit additionally includes coupling circuitry coupled between the charge transfer touch sensor and a component or system of the mobile power equipment. For example, the component may be an internal combustion engine of the equipment and the coupling circuitry may be coupled to a magneto of the internal combustion engine. A change in sensor output voltage signal from a first level to a second level causes the engine magneto to be electrically coupled to ground thereby shutting off the internal combustion engine.

The coupling circuit includes a first and second field effect transistors (FETs) coupled to a gate of a triac bilateral switch. The triac is coupled between the magneto and ground and, when the break over threshold voltage of the triac is exceed by application of a sufficiently high positive or negative voltage to the triac gate terminal, the triac conducts in both forward and reverse direction as necessary to ground the magneto and shut off the engine.

In one preferred embodiment of the operator-sensing circuit of the present invention, the charge-transfer sensor is coupled to two sensing electrodes which are disposed at spaced apart positions on the equipment handle or gripping surfaces. While either or both of the sensing electrodes is contacted by an operator's hand, the sensor output voltage signal remains at the first level and the engine magneto is not grounded out.

In another preferred embodiment of the operator-sensing circuit of the present invention, the coupling circuit includes a relay which switches between two open and closed conditions as the sensor output voltage changes levels (logic high and logic low). The relay may advantageously be electrically coupled to a controller which disengages a component of the mobile power equipment such as a power take off drive when the operator's hands are removed from the sensing electrodes. Alternately, in mobile power equipment driven by an electric motor, such a coupling circuit utilizing a relay and controller may be advantageously used disable or turn off power to the electric motor, when the operator removes his or her hands from the sensing electrodes.

These and other objects, advantages, and features of an exemplary embodiment of the present invention are described in detail in conjunction with the accompanying drawings.

DETAILED DESCRIPTION

Figure 1:
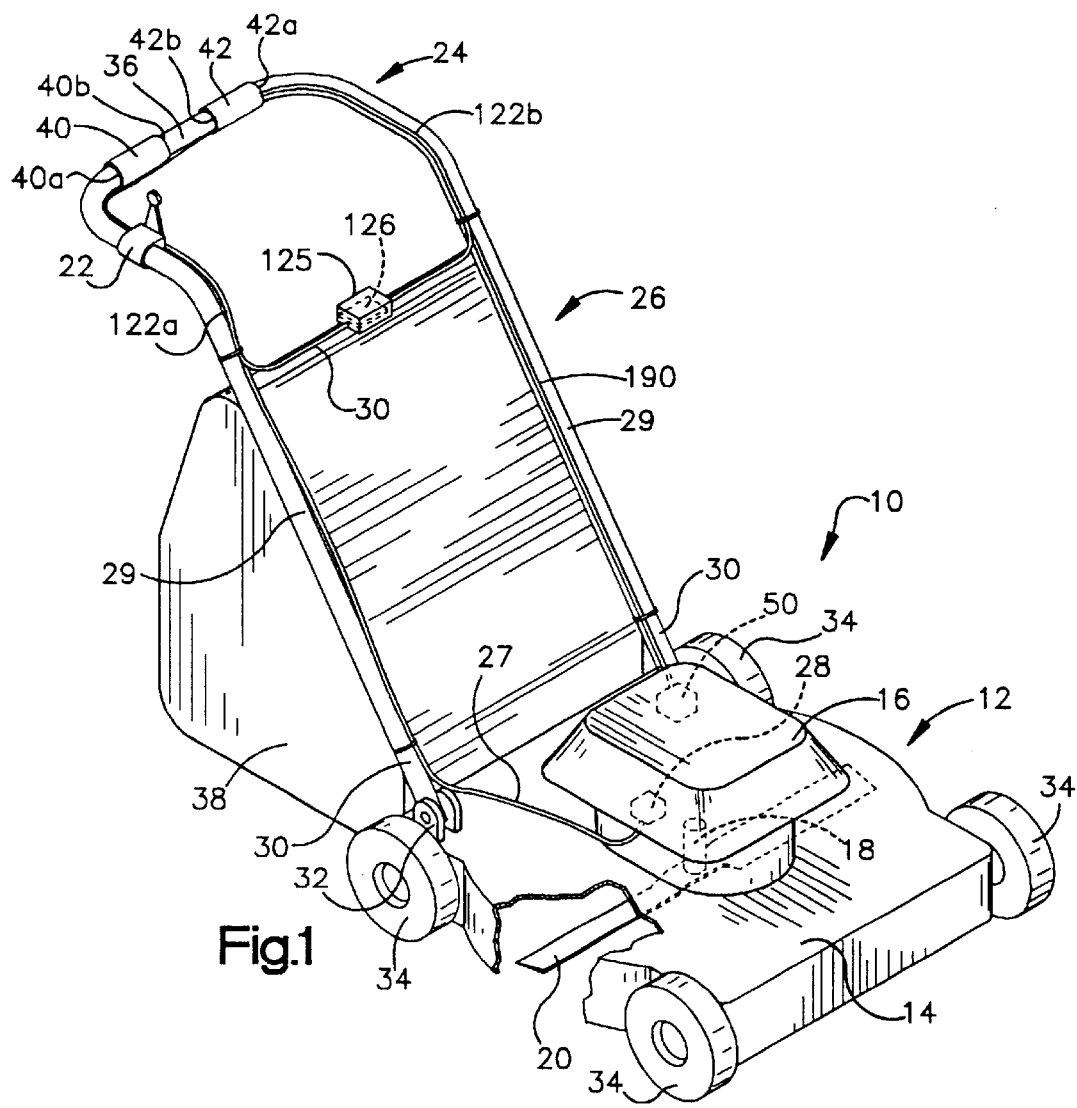
FIG. 1 is a perspective view of a lawnmower including the capacitive operator-sensing circuit the present invention.
Figure 4:
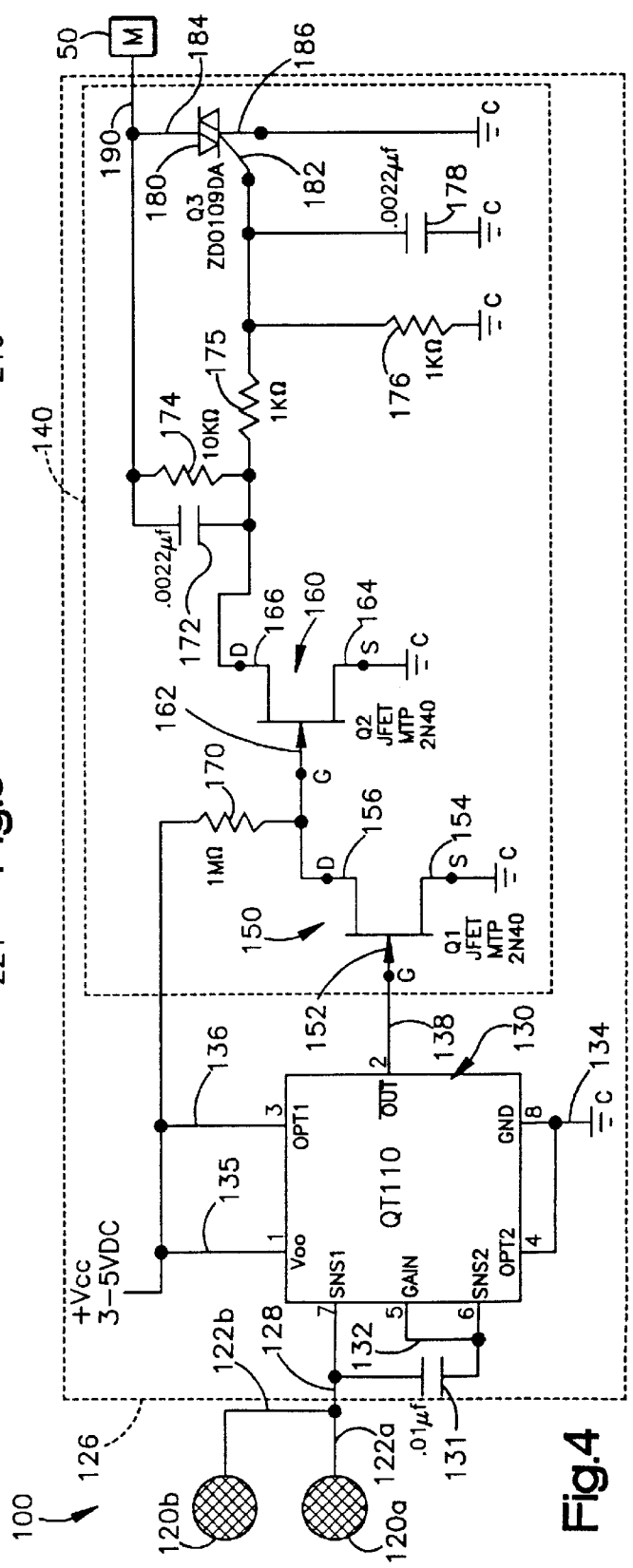
FIG. 4 is a schematic circuit diagram showing the capacitive operator-sensing circuit.

Turning to FIG. 1, a conventional power lawnmower is shown generally at 10. The lawnmower includes a capacitive operator-sensing circuit 100 of the present invention, shown in detail in FIG. 4 and described below. The lawnmower 10 includes a steel or aluminum housing 12 having a flat upper deck 14 that supports an internal combustion engine 16. When the engine 16 is operating it rotatably drives a vertical drive shaft 18 and a grass cutting blade 20 affixed thereto. The grass cutting blade 20 is positioned below the deck 14 and is enclosed by the housing 12. The rotational speed of engine 16 and the cutting blade 20 is controlled by an adjustable throttle 22. The throttle 22 is mounted on an relatively horizontal upper portion 24 of a handle 26 and is mechanically coupled via a throttle cable 27 to an engine throttle 28 to control the speed of the engine 16. The handle 26 includes two parallel angled portions 29. Respective ends 30 of the angled portions 29 are affixed to flanges 32 (only one of which can be seen in FIG. 1) extending upwardly from the housing 12.

Four wheels 34 are attached to the housing 12 so that the lawnmower 10 can be pushed along a desired path of travel so as to mow or cut grass which contacts the rotating cutting blade 20. An operator controls the movement of the lawnmower 10 by grasping and exerting force against the handle 26 along a gripping portion 36 of the handle upper portion 24 which is closest to the operator. By appropriately grasping and exerting force against the handle gripping portion 36, the operator is able maneuver the lawnmower 10, i.e., push and pull the lawnmower 10 as appropriate as the operator walks behind and, turn the lawnmower 10 to the left or right, as necessary, with respect to a straight line of travel.

Typically, the operator positions his or her hands at spaced apart gripping positions along the handle gripping portion 36. Since the handle 26 is typically steel or aluminum which is slippery to an operator's wet or sweaty hands, for comfort, soft plastic, rubber or neoprene grips 40, 42 are advantageously disposed on the handle length 36 to define gripping surfaces and facilitate gripping of the handle 26 by the operator. Alternatively, a single piece of plastic, rubber or neoprene may be disposed to extend the entire length of the handle gripping portion 36 and define a single gripping surface. The grass cut by the lawnmower blade 20 is discharged through an opening in the housing 12 into a grass catcher bag 38 supported by the housing, the angled portions 29 of the handle 26 and a crossmember 30 of the handle 26.

A capacitive, operator-sensing circuit 100 of the present invention is installed on the lawnmower 10 to shut off or stop the engine 16 in the event that the operator's body no longer is in contact with either of the grips 40, 42, that is, the operator does not have either of his or her hands on one of the two grips 40, 42. Essentially, the operator-sensing circuit 100 (shown schematically in FIG. 4) includes a capacitive charge transfer sensor 130 which periodically transfers or pumps small quantity of electric charge to a pair of sensing electrodes 120a, 120b, each of which is affixed to a respective one of the grips 40, 42. If the operator is in contact with either of the two grips 40, 42 a portion of the charge transferred to and stored by the sensing electrodes is transferred to ground (or virtual ground if the operator is not in contact with the earth but rather riding on the mobile equipment, i.e., riding on a lawn tractor) through a capacitive conductive path established by the operator's body.

By monitoring the amount of charge present on the sensing electrodes 120a, 120b, the sensor 130 determines if an operator's hand (or other body part) is overlying or contacting either of the two grips 40, 42. When the sensor 130 determines that there is no operator contact with either of the sensing electrodes 120a, 120b, an output signal of the sensor changes state resulting in a magneto (shown schematically at 50 in FIGS. 1 and 4) of the engine 16 to be grounded thereby shutting off the engine.

While the specific lawnmower 10 shown is a push-type power lawnmower, the capacitive operator-sensing circuit 100 of the present invention is equally adapted to be used in connection with other types of mobile power equipment having an internal combustion engine whether the equipment is push-type or self-propelled. Typical examples of such equipment would include push-type and self-propelled lawnmowers, rototillers, cultivators, snowblowers, power grass edgers, riding lawnmowers, garden tractors, skid steer vehicles and other such equipment where the operator holds onto one or more gripping surfaces such as a handle, a lever or levers, or a steering wheel of the equipment to push, guide, or steer the equipment along a desired path of travel.

It should also be appreciated that while the specific embodiment of the operator-sensing circuit 100 described herein includes two sensing electrodes 120a, 120b, the circuit 100 and specifically the preferred capacitive, charge transfer sensor 130 is equally capable of functioning properly with a single sensing electrode, i.e. a single electrode spanning the entire gripping surface of a handle or steering wheel or two, three or more sensing electrodes. Only minor adjustments, well known to those skilled in the art, to the sensor 130 are required to support different numbers, size and configurations of sensing electrodes and provide acceptable threshold level and sensitivity values for the circuit 100. Sensitivity refers to the magnitude of the gain of the sensor 130 while threshold level refers to the percent of absolute signal level at which the sensor changes output state. Sensitivity is related to sensing electrode surface area, orientation with respect to the object being sensed, sensed object composition, and the ground coupling quality of both the sensor circuit and the sensed object.

First Preferred Embodiment of Sensing Electrodes

The capacitive, operator-sensing circuit 100 comprises a pair of capacitive sensing electrodes 120a, 120b which are permanently affixed to the handle grips 40, 42 and electrically coupled to a capacitive, charge-transfer sensor 130. In a first preferred embodiment of the circuit 100, the sensing electrodes 120a, 120b comprise sections or lengths of 22 gauge uninsulated conductive copper wire. As can best be seen in FIG. 2, the uninsulated wire section comprising the sensing electrode 120a is wrapped in a longitudinal spiral fashion around the outer surface of the handle grip 40 spanning the grip from one end 40a to an opposite end 40b. The same is true for the grip 42, an uninsulated wire section comprising the sensing electrode 120b is wrapped in a longitudinal spiral fashion around the outer surface of the handle grip 42 spanning the grip from one end 42a to an opposite end 42b.

The uninsulated wire sections 120a, 120b are then affixed to the handle grips 40, 42 by wrapping respective lengths of electrical tape 121 (or other similar adhesive, dielectric material) around the grips 40, 42 in a similar spiral turn fashion between the opposite ends 40a, 40b, 42a, 42b of the respective grips 40, 42.

Figure 2:
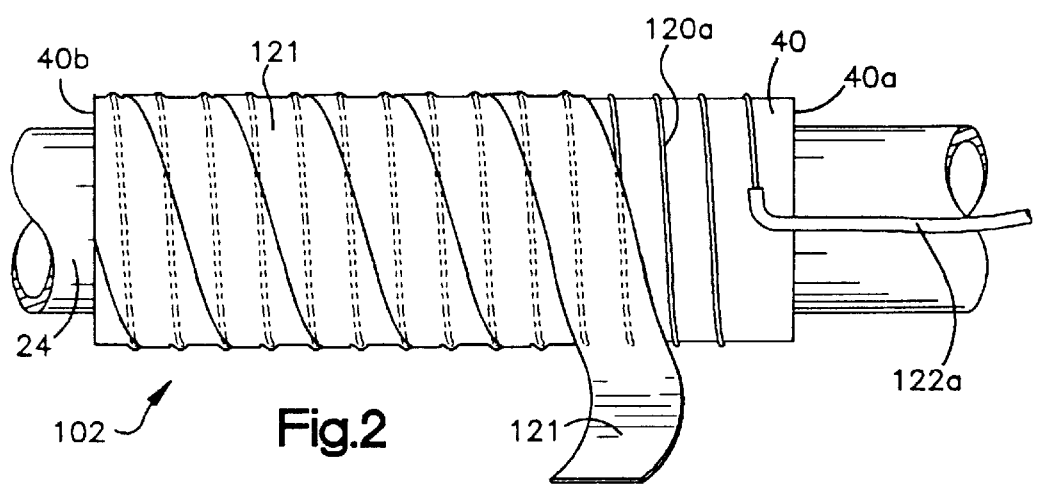
FIG. 2 is a view partially in elevation and partially in section of a portion of a lawnmower handle showing a first embodiment of a sensing electrode of the capacitive operator-sensing circuitt.

While FIG. 2 shows approximately 14 turns of uninsulated wire spanning the grip 40, the longitudinal length of the grip, the gauge of the wire used and the dielectric characteristics of the overlying adhesive material (electrical tape, duct tape, friction tape, etc.) will determine how many turns will be required. For example, 9 turns of 22 gauge copper "bus" wire overlaid by standard black electrical tape was found suitable for a grip having a longitudinal length of 4 inches and an outer diameter of 1½ inches.

Insulated wire sections 122a, 122b are electrically coupled to one end of respective uninsulated spiral wrapped wire sections 120a, 120b. The insulated wire sections 122a, 122b extend from the grips 40, 42 to a housing 125 mounted on a crossmember 30 of the handle 26. The insulated wire sections 122a, 122b are necessary to prevent shorting of the sensing electrodes 120a, 120b by the metal handle 26.

The remaining circuitry of the operator-sensing circuit 100 is mounted on a printed circuit board (shown schematically at 126 in FIGS. 1 and 4) disposed within the housing 125. The remaining circuitry of the circuit includes the charge-transfer sensor 130, a DC power supply (battery) (shown schematically as Vcc in FIG. 4) and a coupling circuit 140 for coupling an output signal (at pin 2) of the sensor 130 to the engine magneto 50. Preferably, the charge-transfer sensor 130 is a QT 110 charge transfer integrated circuit manufactured by Quantum Research Group Ltd., 651 Holiday Drive, Bldg. 5/300, Pittsburgh, Pa. 15220. A twelve page specification sheet published in 1999 by Quantum Research Group Ltd. describing the characteristics of the QT110 integrated circuit (IC) entitled "QProx™ QT110 Charge-Transfer Touch Sensor" is incorporated herein in its entirety by reference.

Ends of the insulated wire sections 122a, 122b extend through openings (not shown) in the housing 125 and are electrically coupled to a single insulated conductor 128. The insulated conductor 128, in turn, is electrically coupled to an input terminal of the charge-transfer sensor 130 (pin 7—sensel).

The charge-transfer sensor 130 output is active low. When the operator of the mower 10 is gripping either or both of the two grips 40, 42, the charge magnitude sensed by the sensor is low and the output signal, Vo, of the sensor 130 (pin 2) is a low DC voltage of essentially zero volts, Vo=0 volts. On the other hand, when the operator of the mower 10 is not gripping or touching either of the two grips 40, 42, the charge sensed by the sensor is high and the output signal of the sensor 130 (pin 2) is a high DC voltage, having a typical value of Vo=Vcc−0.7 volts, e.g., if Vcc=5 volts, Vo=5 volts−0.7 volts=4.3 volts.

An advantage to the Quantum QT110 is that the QT110 IC is highly tolerant to changes in the capacitance of the 0.01 $\mu$F reference capacitor 131 because the QT110 IC computes the threshold level ratiometrically with respect to absolute load and does so dynamically at all times.

Periodically, the sensor 130 transfers or pumps out a small magnitude of charge to the sensing electrodes 120a, 120b and the floating transfer capacitor 131. The charge is transferred approximately 10–15 times per second. The sensor 130 monitors the charge buildup on the sensing electrodes 120a, 120b and the floating transfer capacitor 131. The reference 0.01 microfarad ($\mu$F) capacitor 131 functions as a floating transfer capacitor and is coupled between pins 6 and 7 of the sensor 130. The sensor 130 may be set for one of three internal gain levels (high, medium and low) by using pin 5. The gain of the sensor 130, in part determines the sensitivity of the circuit 100. If pin 5 is left open, the gain of the sensor 130 is high. If pin 5 is tied or electrically coupled to pin 6, the gain of the sensor is medium. If pin 5 is tied to pin 7, the gain of the sensor is low. From empirical testing for the particular sensing electrodes tested, the circuit 100 was found to function properly with a medium gain, thus, pin 5 is tied to pin 6 via a jumper 132. A DC supply voltage Vcc of positive 3–5 volts is supplied to pins 1 and 3 of the sensor 130 via leads 135, 136. The DC supply voltage Vcc may preferably be obtained from a long life battery (nickel-cadmium (Ni—Cd), nickel-metal hydroxide (Ni—MH) or lithium-ion (Li—Ion)), or the like, since the power consumption requirements of the sensor 130 and coupling circuit 140 are low, e.g., under 20 $\mu$A for the sensor 130.

If, during a predetermined consecutive number of sensing periods, the sensed charge of the sensing electrodes 120a, 120b decreases by a predetermined threshold amount, the output pin 2 of the sensor 130 will change from a high voltage output to a low voltage output (logic high to logic low). The reduction in sensed charge by an amount greater than the predetermined threshold amount indicates that an operator of the equipment 10 is gripping one or both of the sensing electrodes 120a, 120b thereby bleeding off or discharging the charge of the sensing electrodes 120a, 120b to ground or a virtual ground, i.e., the equipment itself in the event the operator is riding on the equipment and not in contact with true earth ground. As long as the sensed charge remains low, that is, does not increase by a predetermined threshold amount, the output signal of the sensor 130 will remain a low DC output voltage (logic low).

If, on the other hand, during a predetermined consecutive number of sensing periods, the sensed charge of the sensing electrodes 120a, 120b increases by the predetermined threshold amount, the output pin 2 of the sensor 130 will change from a low voltage output to a high voltage output (logic low to logic high). The increase in sensed charge by an amount greater than the predetermined threshold amount indicates that an operator of the equipment 10 is no longer gripping either of the sensing electrodes 120a, 120b thus sensed charge increases because the operator is no longer bleeding off or discharging the charge of the sensing electrodes 120a, 120b to ground.

The sensor 130 employs a hysteresis effect with regard to the predetermined threshold change magnitude required to switch between logic high and logic low output states to avoid "bouncing" between output states in the event that sensed charge has just crossed a threshold value (resulting in a change of output state) but remains near the threshold value. The charge buildup on the sensing electrodes 120a, 120b is proportional to the effective capacitance of the electrodes. Absent an operator, the electrodes 120a, 120b and the handle gripping portion 36 underlying the electrodes 120a, 120b function as capacitor plates and result in some magnitude of effective capacitance. The charge buildup on the electrodes 120a, 120b is proportional to this effective capacitance in accordance with the general capacitance equation Q=C×V, where, Q is charge on a capacitor, C is capacitance of a capacitor and V is voltage applied across the capacitor plates. The hands of the operator can be thought of as capacitor plates and, upon gripping the grips 40, 42, the proximity of the operator's hands to the electrodes 120a, 120b changes the magnitude of the effective capacitance of the electrodes 120a, 120b. Essentially, the operator gripping the grips 40, 42 establishes a capacitive path to ground and bleeds charge built up on the electrodes 120a, 120b.

A conductor 130 electrically couples the output signal at pin 2 of the sensor 130 to the coupling circuit 140 which, in turn, is coupled to the magneto 50. The coupling circuit 140 includes a pair of complementary junction field effect transistors (JFETs) 150, 160 and the triac 180. A gate terminal 152 of the JFET 150 is coupled to the sensor output via the conductor 138. A drain terminal 156 of the JFET 150 is coupled to Vcc through a 1 MΩ pull-up resistor 170 and a source terminal 154 of the JFET 150 is coupled to circuit common or ground C. The drain terminal 156 of the JFET 150 is coupled to a gate terminal 162 of the JFET 160, while a drain terminal 166 of the JFET 160 is coupled to a gate terminal 182 of the triac 180 through a 1 KΩ resistor 175. The JFET 160 is in an open drain configuration. The triac 180 has its terminals 184, 186 electrically coupled between the engine magneto 50 (via conductor 190) and ground C such that when the voltage applied to the gate 182 of the triac 180 exceeds the gate threshold voltage and current, the triac 180 turns on and grounds the magneto 50. The triac 180 is advantageously used in the coupling circuit 140 because, when turned on, it is capable of grounding both positive and negative magneto pulses.

Other components of the coupling circuit 140 include a 0.0022 μF capacitor 172 coupled in parallel with a 10 KΩ resistor 174 between the drain terminal 166 of the JFET 160 and the magneto 50. A 1 KΩ resistor 175 is coupled between the drain terminal 166 of the JFET 160 and the gate terminal 182 of the triac 180. A 1 KΩ resistor 176 and a 0.0022 μF capacitor 178 are coupled in parallel between the gate terminal 182 of the triac 180 and circuit common C.

When the output signal, Vo, of the sensor 130 is low (i.e., the sensor output signal is low DC voltage indicative that an operator is gripping one or both of the sensing electrodes 120a, 120b), the JFET 150 is off (in a nonconducting state) since its source is coupled to ground. When the JFET 150 is turned off, the gate of the JFET 160 is high (at Vcc voltage) and since the source 164 is at ground, the JFET 160 is on (conducting state). When the JFET 160 is on, the voltage at the drain terminal of the JFET 160 and at the gate terminal 182 of the triac 180 are essentially at zero volts. A triac gate voltage of zero volts maintains the triac 180 in a nonconducting state and the magneto is not grounded out. Thus, the engine 16 is not turned off.

When the output signal, Vo, of the sensor 130 is high (i.e., the sensor output signal is high DC voltage (Vcc—0.7 volts) indicative that an operator is not gripping either of the sensing electrodes 120a, 120b), the JFET 150 is on (in a conducting state). When the JFET 150 is on, the gate of the JFET 160 is low (essentially at zero volts) and, thus, the JFET 160 is off. When the JFET 160 is off, the magnitude of the voltage at the gate terminal 182 of the triac 180 is essentially $\frac{1}{12}$ of the magnitude of the voltage of the magneto 50 because of the voltage divider formed by the three resistors 174, 175, 176 coupled in series between the magneto 50 and circuit ground C. Since the magneto primary voltage is high, approximately 300–400 V, a gate voltage of $\frac{1}{12}$ of the magneto voltage is sufficient to turn the triac 180 on and thereby ground out the magneto 50. Grounding out the magneto 50 turns the engine 16 off.

Second Preferred Embodiment of Sensing Electrodes

Figure 3:
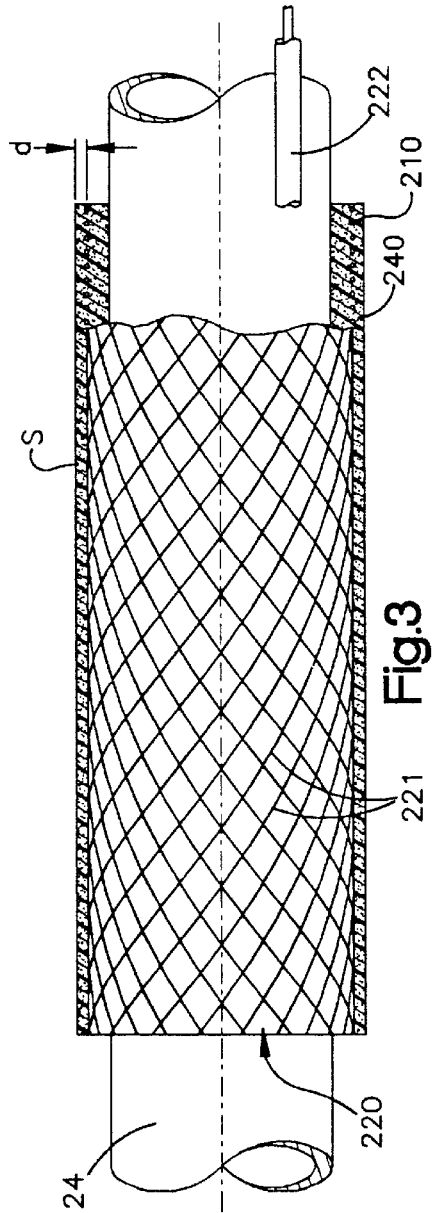
FIG. 3 is a view partially in elevation and partially in section of a portion of a lawnmower handle showing a second embodiment of a sensing electrode of the capacitive operator-sensing circuit.

A second preferred embodiment of a sensing electrode 220 suitable for use with the capacitive operator-sensing circuit 100 is shown in FIG. 3. While only one sensing electrode is shown in FIG. 3, it should be understood that two (or more) sensing electrodes similar to electrode 220 may be utilized with the capacitive operator-sensing circuit 100 just as was the case with sensing electrodes 120a, 120b. In this second embodiment, the sensing electrode 220 comprises a cylindrical shaped conductive mesh or grid 221 that is fabricated into the grip 240. The grip 240 is preferably made of a durable, easy to grip material such as rubber, plastic, neoprene, Santoprene® material, etc.

The conductive grid preferably is comprised of copper alloy. The conductive grid 221 is disposed at a depth d radially inwardly from an outer peripheral surface S of the grip 240. A typical depth d for the conductive grid would be 0.005–0.020 inch.

The advantage of the conductive grid 221 is that the sensing electrode 220 is integral with the grip 240, that is, the grip 240 and sensor 220 are of unitary, one-piece construction and, therefore, are more durable than the sensor 120a, 120b, electrical tape and grip 40, 42 combinations of the first embodiment. As with the first embodiment, an insulated wire 222 electrically couples the sensor 220 to the conductive lead 128 which, in turn, is coupled to input pin 7 of the sensor 130.

Second Preferred Embodiment of Coupling Circuit

Many types of self-propelled power equipment have one or more power take-off drives driven by the engine of the equipment. Typically, when a power take-off drive is engaged engine power is used to rotate a power take-off shaft. Different equipment may be coupled to a power take-off shaft, i.e., a cutting blade, a snowblower auger, etc. In some instances it may be desirable to disengage a power take-off instead of shutting off an engine in the event the operator's hands are no longer in contact with either of the sensing electrodes 120a, 120b. Other types of mobile power equipment utilize electric motors. In such equipment, stopping the motor involves interrupting the supply of power to the motor as opposed to grounding a magneto in an internal combustion engine.

Figure 5:
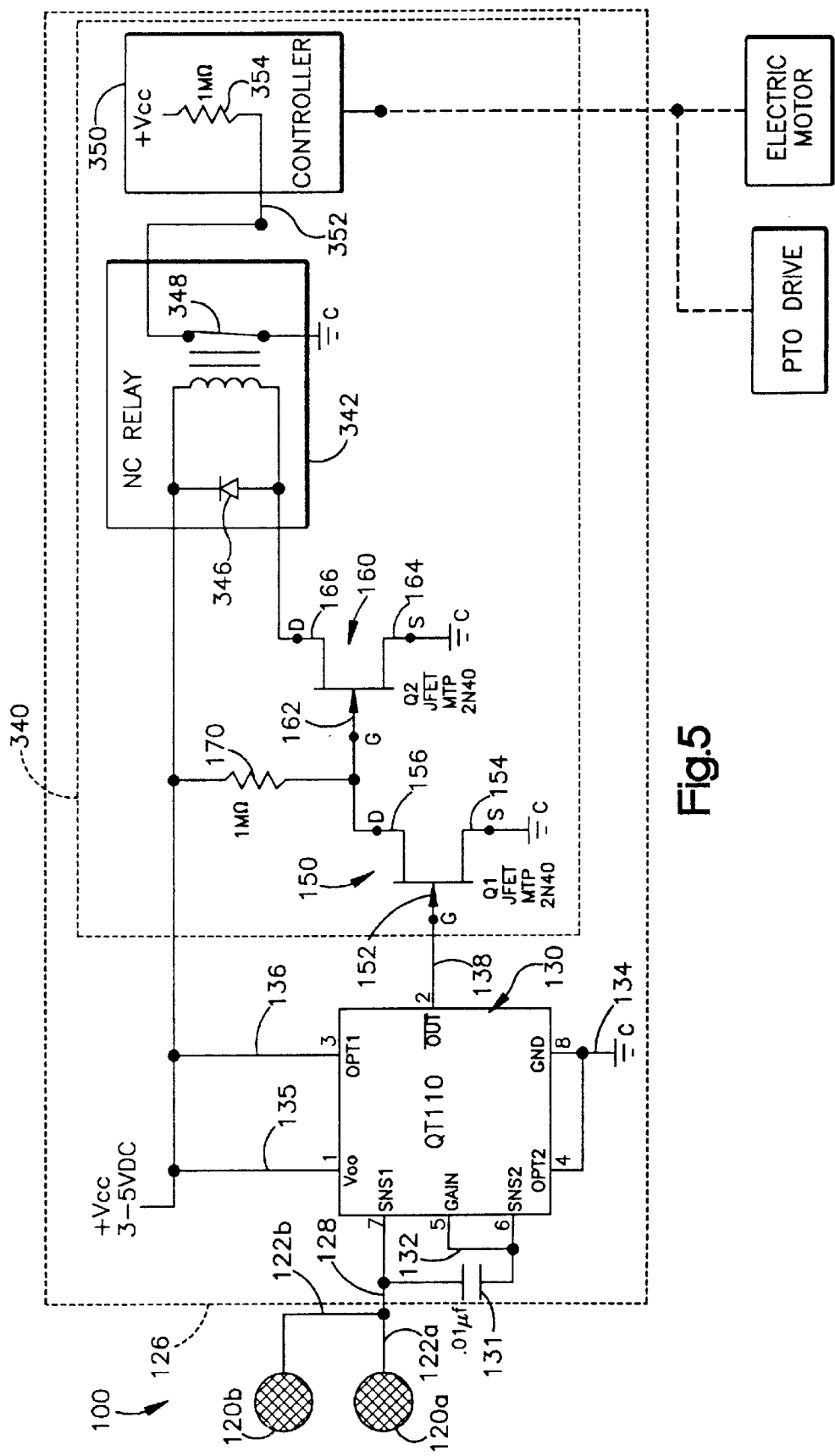
FIG. 5 is a schematic circuit diagram showing a second embodiment of a coupling circuit of the capacitive operator-sensing circuit.

A second preferred embodiment of a coupling circuit 340 is shown in FIG. 5. The coupling circuit 340 may be advantageously used with the capacitive, operator-sensing circuit 100 to disengage a power take-off drive or stop an electric motor when the operator is not gripping either of the sensing electrodes 120a, 120b. Those components of the operator-sensing circuit 100 that are the same as those described in the first preferred embodiment are labeled with the same reference numbers as in FIG. 4 and operate as described with respect to that embodiment.

The coupling circuit 340 of this embodiment includes the pair of JFETs 150, 160 as previously described. A drain terminal 166 of the JFET 160 is coupled, in an open drain configuration, to one terminal of a normally closed relay 342 (1 Form C relay—normally closed contacts). The other end of the normally closed relay 342 is coupled to Vcc (+3–5 V DC). Internally, as can be seen in FIG. 5, the normally closed relay 342 comprises a flyback diode 346 coupled in parallel with a coil 344 which, in turn, is inductively coupled to the normally closed switch 348.

One terminal of the normally closed switch 348 is coupled to circuit common C while the other end of the switch 348 is electrically coupled to an input terminal 352 of a controller 350. The controller 350 controls one or more power units (as shown by the dashed line in FIG. 5) and allows for level shifting of output voltages. For example, the controller 350 may be electrically coupled to an electric motor 52 of a mobile power equipment unit and function to interrupt the supply of power to the electric motor 52 and thereby stop the motor 52 when an operator removes his or her hands from the sensing electrodes 120a, 120b. Alternately, the controller 350 may be electrically coupled to a power take-off drive 54 of a mobile power equipment unit and functions to disengage the power take-off drive shaft being driven by an engine of the unit when an operator removes his or her hands from the sensing electrodes 120a, 120b. The selection of a specific controller from numerous controller products offered by various manufacturers will be dependent on the nature of the system to be controlled, the desired voltage shifting required, etc. as is known to those skilled in the art.

The controller 350 senses the voltage state at the input terminal 352 of the controller 350. The controller 350 includes a 1 MΩ pull-up resistor 354 coupled between Vcc and the input terminal 352. So long as the switch 348 remains closed, the voltage at the input terminal 352 will remain logic low. If the switch 348 opens, the voltage at the input terminal 352 will switch to logic high.

When the operator's hands are in contact with at least one of the sensing electrodes 120a, 120b, the voltage output, Vo, of pin 2 of the sensor 130 is logic low, the JFET 150 is off and the JFET 160 is in a conductive state, as described previously. When the JFET 160 is conducting, the relay 342 is energized and the normally closed switch 348 remains open and the voltage sensed by the controller 350 at input terminal 352 is logic high. As long as the voltage state of the input terminal 352 is logic high, the controller 350 permits the electric motor 52 to continue to run or permits the power take-off drive 54 to remain engaged. The current sunk by JFET 160 is typically less than 250 mA.

If the operator's hands lose contact with both of the sensing electrodes 120a, 120b, the voltage output, Vo, of pin 2 of the sensor 130 switches to logic high, the JFET 150 switches to a conductive state and the JFET 160 switches off. When the JFET 160 is in a nonconducting state, the relay 342 is deenergized and the normally closed switch 348 closes. Since there is a conductive path to ground through the switch 348, the controller input terminal 352 is at logic low. The controller 350 switches it output state to shut off the electric motor 52 or disengage the power take-off drive 54.

It should be recognized by those skilled in the art that there are numerous other possibilities for the design of the coupling circuit of the present invention depending on the nature and number of the systems sought to be controlled (internal combustion engine, electric motor, power take-off unit, etc.). For example, a normally closed relay may be used to ground the magneto of an internal combustion engine without the need for a controller should an operator remove both hands from the sensing electrodes 120a, 120b. A unit of mobile power equipment having an internal combustion engine and one or more power take-off drives and/or electric motors may advantageously have a coupling circuit that employs a triac to ground out the internal combustion engine and a relay and controller combination to stop or disengage the electric motor and/or power take-off drive.

While the preferred embodiments of the present invention have been described with degree of particularity, it is the intent that the scope of the present invention be construed to include all modifications from and to the disclosed embodiments falling within the spirit or scope of the appended claims.

What is claimed is:

1. A capacitive, operator-sensing circuit for sensing the presence of a hand of an operator on a gripping surface of a unit of power equipment having an internal combustion engine and shutting off the engine if the operator's hand is removed from the gripping surface, the operator-sensing circuit comprising:

a) a sensing electrode affixed to the gripping surface, a quantity of charge present on the sensing electrode having a first value if the operator's hand overlies a portion of the sensing electrode and having a second value if the operator's hand does not overlie the sensing electrode;

b) a charge-transfer sensor electrically coupled to the sensing electrode periodically transferring charge to the sensing electrode and sensing the quantity of charge on the sensing electrode, an output of the charge-transfer sensor generating a first output signal when the first value of the sensed charge on the sensing electrode is sensed and a second output signal, different from the first output signal, when the second value of the sensed charge on the sensing electrode is sensed; and c) coupling circuitry electrically coupling a magneto of the engine and the charge-transfer sensor for grounding the engine magneto and thereby shutting off the engine when the second output signal is generated by the charge-transfer sensor.

2. The operator-sensing circuit of claim 1 wherein the sensing electrode is affixed to the gripping surface.

3. The operator-sensing circuit of claim 2 wherein the sensing electrode comprises a conductive wire coiled around a length of the gripping surface and adhesively attached to the gripping surface.

4. The operator-sensing circuit of claim 1 wherein the sensing electrode is integral with the gripping surface.

5. The operator-sensing circuit of claim 1 wherein the sensing electrode comprises a section of conductive wire mesh fabricated into the gripping surface.

6. The operator-sensing circuit of claim 1 wherein the gripping surface comprises first and second spaced apart grips and the sensing electrode comprises a first sensing electrode affixed to the first grip and a second sensing electrode affixed to the second grip.

7. The operator-sensing circuit of claim 1 wherein the charge-transfer sensor comprises a digital integrated circuit.

8. The operator-sensing circuit of claim 1 wherein the first output signal of the sensor output is a logic low voltage output state and the second output signal of the sensor output is a logic high voltage output state.

9. The operator-sensing circuit of claim 1 wherein the coupling circuit includes a triac electrically coupled between the engine magneto and ground and additionally includes circuitry to electrically couple a signal representative of the sensor output to a gate terminal of the triac, the triac being turned on when the sensor generates the second output signal and being turned off when the sensor generates the first output signal.

10. The operator-sensing circuit of claim 1 wherein the sensor is adjustable with respect to a magnitude of decrease in sensed charge on the sensing electrode that will result in the sensor output switching from the first output signal to the second output signal and a magnitude of increase in sensed charge on the sensing electrode that will result in the sensor output switching from the second output signal to the first output signal.

11. A capacitive operator-sensing circuit in combination with a mobile power equipment unit, the combination comprising:
   a) the mobile power equipment including an internal combustion engine, an engine magneto, and a gripping surface for an operator to grip and control movement of the mobile power equipment unit; and
   b) the capacitive operator-sensing circuit adapted to sense the presence of a hand of an operator on the gripping surface to shut off the engine if the operator's hand is removed from the gripping surface, the capacitive operator-sensing circuit including:
      1) a sensing electrode affixed to the gripping surface, a quantity of charge present on the sensing electrode having a first value if the operator's hand overlies a portion of the sensing electrode and having a second value if the operator's hand does not overlie the sensing electrode;
      2) a charge-transfer sensor electrically coupled to the sensing electrode periodically transferring charge to the sensing electrode and sensing the quantity of charge on the sensing electrode, an output of the sensor generating a first output signal when the first value of sensed charge on the sensing electrode is sensed and a second output signal, different from the first output signal, when the second value of the sensed charge on the sensing electrode is sensed; and
      3) coupling circuitry electrically coupled between the engine magneto and the charge-transfer sensor for grounding the engine magneto and thereby shutting off the engine when the second output signal is received from the charge-transfer sensor.

12. The combination operator-sensing circuit and mobile power equipment of claim 11 wherein the operator-sensing circuit sensing electrode is affixed to the gripping surface.

13. The combination operator-sensing circuit and mobile power equipment of claim 12 wherein the operator-sensing circuit sensing electrode comprises a conductive wire coiled around a length of the gripping surface and adhesively attached to the gripping surface.

14. The combination operator-sensing circuit and mobile power equipment of claim 11 wherein the operator-sensing circuit sensing electrode is integral with the gripping surface.

15. The combination operator-sensing circuit and mobile power equipment of claim 11 wherein the operator-sensing circuit sensing electrode comprises a section of conductive wire mesh fabricated into the gripping surface.

16. The combination operator-sensing circuit and mobile power equipment of claim 11 wherein the mobile power equipment gripping surface comprises first and second spaced apart grips and the operator-sensing circuit sensing electrode comprises a first sensing electrode affixed to the first grip and a second sensing electrode affixed to the second grip.

17. The combination operator-sensing circuit and mobile power equipment of claim 11 wherein the operator-sensing circuit charge-transfer sensor comprises a digital integrated circuit.

18. The combination operator-sensing circuit and mobile power equipment of claim 11 wherein the first output signal of the operator-sensing circuit sensor output is a logic low voltage output state and the second output signal of the sensor output is a logic high voltage output state.

19. The combination operator-sensing circuit and mobile power equipment of claim 11 wherein the operator-sensing circuit coupling circuit includes a triac electrically coupled between the mobile power equipment engine magneto and ground and additionally includes circuitry to electrically couple a signal representative of the sensor output to a gate terminal of the triac, the triac being turned on when the sensor generates the second output signal and being turned off when the sensor generates the first output signal.

20. A method of sensing the presence of a hand of an operator on a gripping surface of a mobile power equipment unit and causing cessation of operation of a component system of the equipment if the operator's hand is removed from the gripping surface, the steps of the method comprising:
   a) providing a sensing electrode affixed to the mobile power equipment gripping surface wherein a quantity of charge on the sensing electrode has a first value if the operator's hand overlies a portion of the sensing electrode and has a second value if the operator's hand does not overlie the sensing electrode;
   b) providing a charge-transfer sensor electrically coupled to the sensing electrode and periodically transferring charge to the sensing electrode, sensing the quantity of charge on the sensing electrode and generating a first output signal when the first value of sensed charge on the sensing electrode is sensed and a second output signal, different from the first output signal, when the second value of sensed charge of the sensing electrode is sensed; and
   c) providing coupling circuitry electrically coupled between the charge-transfer sensor and the component, the coupling circuitry causing cessation of operation of the component system when the second output signal is generated by the charge-transfer sensor.

21. The method of sensing the presence of a hand of an operator of claim 20 wherein the component system is an internal combustion engine of the equipment and the coupling circuitry electrically couples a magneto of the engine to ground to shut off the engine when the second output signal is generated by the charge-transfer sensor.

22. The method of sensing the presence of a hand of an operator of claim 20 wherein the component system is a power take-off drive of the equipment and the coupling circuitry includes a relay and a controller to disengage a drive shaft of the power take-off drive from an engine of the equipment when the second output signal is generated by the charge-transfer sensor.

23. The method of sensing the presence of a hand of an operator of claim 20 wherein the component system is an electric motor of the equipment and the coupling circuitry interrupts a supply of power to the electric motor to shut off the electric motor when the second output signal is generated by the charge-transfer sensor.

24. A capacitive, operator-sensing circuit for sensing the presence of a hand of an operator on a gripping surface of a unit of power equipment and causing cessation of operation of a component of the equipment if the operator's hand is removed from the gripping surface, the operator-sensing circuit comprising:

a) a sensing electrode affixed to the gripping surface, a quantity of charge present on the sensing electrode having a first value if the operator's hand overlies a portion of the sensing electrode and having a second value if the operator's hand does not overlie the sensing electrode;

b) a charge-transfer sensor electrically coupled to the sensing electrode periodically transferring charge to the sensing electrode and sensing the quantity of charge on the sensing electrode, an output of the charge-transfer sensor generating a first output signal when the first value of the sensed charge on the sensing electrode is sensed and a second output signal, different from the first output signal, when the second value of the sensed charge on the sensing electrode is sensed; and c) coupling circuity electrically coupled between the charge-transfer sensor and the component, the coupling circuitry causing cessation of operation of the component system when the second output signal is generated by the charge-transfer sensor.

25. The operator-sensing circuit of claim 24 wherein the component is an internal combustion engine of the equipment and the coupling circuitry electrically couples a magneto of the engine to ground to shut off the engine when the second output signal is generated by the charge-transfer sensor.

26. The operator-sensing circuit of claim 24 wherein the component is a power take-off drive of the equipment and the coupling circuitry includes a relay and a controller to disengage a drive shaft of the power take-off drive from an engine of the equipment when the second output signal is generated by the charge-transfer sensor.

27. The operator-sensing circuit of claim 24 wherein the component is an electric motor of the equipment and the coupling circuitry interrupts a supply of power to the electric motor to shut off the electric motor when the second output signal is generated by the charge-transfer sensor.

28. The operator-sensing circuit of claim 24 wherein the sensing electrode is affixed to the gripping surface.

29. The operator-sensing circuit of claim 24 wherein the sensing electrode comprises a conductive wire coiled around a length of the gripping surface and adhesively attached to the gripping surface.

30. The operator-sensing circuit of claim 24 wherein the sensing electrode is integral with the gripping surface.

31. The operator-sensing circuit of claim 24 wherein the sensing electrode comprises a section of conductive wire mesh fabricated into the gripping surface.

32. The operator-sensing circuit of claim 24 wherein the gripping surface comprises first and second spaced apart grips and the sensing electrode comprises a first sensing electrode affixed to the first grip and a second sensing electrode affixed to the second grip.

33. The operator-sensing circuit of claim 24 wherein the charge-transfer sensor comprises a digital integrated circuit.

34. The operator-sensing circuit of claim 24 wherein the first output signal of the sensor output is a logic low voltage output state and the second output signal of the sensor output is a logic high voltage output state.

35. The operator-sensing circuit of claim 24 wherein the coupling circuit includes a triac electrically coupled between the engine magneto and ground and additionally includes circuitry to electrically couple a signal representative of the sensor output to a gate terminal of the triac, the triac being turned on when the sensor generates the second output signal and being turned off when the sensor generates the first output signal.

36. The operator-sensing circuit of claim 24 wherein the sensor is adjustable with respect to a magnitude of decrease in sensed charge on the sensing electrode that will result in the sensor output switching from the first output signal to the second output signal and a magnitude of increase in sensed charge on the sensing electrode that will result in the sensor output switching from the second output signal to the first output signal.

* * * * *